(12) United States Patent
McLoughlin et al.

(10) Patent No.: US 6,348,098 B1
(45) Date of Patent: Feb. 19, 2002

(54) FLOW CONTROLLER

(75) Inventors: Robert F. McLoughlin, Pelham, NH (US); George L. Gonnella, Pepperell; Timothy J. King, Sudbury, both of MA (US)

(73) Assignee: Mykrolis Corporation, Bedford, MA (US)

(*) Notice: Subject to any disclaimer, the term of this patent is extended or adjusted under 35 U.S.C. 154(b) by 0 days.

(21) Appl. No.: 09/488,146

(22) Filed: Jan. 20, 2000

Related U.S. Application Data

(60) Provisional application No. 60/116,511, filed on Jan. 20, 1999, and provisional application No. 60/143,370, filed on Jul. 12, 1999.

(51) Int. Cl.[7] .......................... B05B 9/03; B05B 12/08; B05C 11/00; B05D 7/00; F16K 31/12

(52) U.S. Cl. .................. 118/313; 118/688; 118/692; 137/12; 137/85; 137/487; 239/533.1

(58) Field of Search ................. 118/685, 684, 118/678, 683, 712, 713, 313, 320, 688, 692, 314, 315; 239/104, 110, 11, 533.1, 533.15; 137/2, 12, 87, 85, 86, 486, 487.5, 481, 488; 91/358 R, 362, 463, 464

(56) References Cited

U.S. PATENT DOCUMENTS

| | | | |
|---|---|---|---|
| 3,313,212 A | * | 4/1967 | Baker et al. ................ 91/387 |
| 5,115,842 A | * | 5/1992 | Crafts et al. ............... 141/286 |
| 5,134,962 A | * | 8/1992 | Amada et al. ............. 118/688 |
| 5,167,837 A | | 12/1992 | Snodgrass et al. .......... 210/767 |
| 5,490,765 A | | 2/1996 | Bailey et al. ................. 417/2 |
| 5,493,488 A | | 2/1996 | Castle et al. ................ 364/162 |
| 5,516,429 A | | 5/1996 | Snodgrass et al. .......... 210/767 |
| 5,527,161 A | | 6/1996 | Bailey et al. ................ 417/53 |
| 5,549,137 A | * | 8/1996 | Lenz et al. ................. 137/486 |
| 5,599,394 A | | 2/1997 | Yabe et al. ................. 118/319 |
| 5,720,814 A | * | 2/1998 | Takagi et al. .............. 118/319 |
| 5,882,408 A | | 3/1999 | Fujita ........................ 118/684 |
| 5,900,045 A | | 5/1999 | Wang et al. ................. 95/241 |
| 5,950,668 A | * | 9/1999 | Baumann ................ 137/487.5 |

OTHER PUBLICATIONS

Wherry et al., Process Control: Linear–Position Actuators. Perry's Chemical Engineers' Handbook 6th Ed., McGraw Hill, 1984, pp. 22–84 to 2–87.*

Copy of the international Search Report dated May 30, 2000.

* cited by examiner

Primary Examiner—Richard Crispino
Assistant Examiner—J. A. Lorengo
(74) Attorney, Agent, or Firm—Nields & Lemack

(57) ABSTRACT

A control system for digitally monitoring and/or controlling pressure to a pneumatic load such as a stop/suckback valve. Pressure is sensed in the pneumatic fluid input lines to the pneumatic load, and a closed loop control is used to maintain the pressure at a predetermined level. In an alternative embodiment, the control system is used to ensure equal dispensing in multi-point dispense apparatus. Thus, pressure is sensed downstream of each valve in fluid communication with a respective nozzle. Any pressure differential detected is corrected by appropriate valve adjustment.

11 Claims, 6 Drawing Sheets

FLOW CONTROLLER

This application claims benefit of Provisional Application No. 60/116,511 filed Jan. 20, 1999, which claims benefit of Provisional Application No. 60/143,370 filed Jul. 12, 1999.

BACKGROUND OF THE INVENTION

During the manufacture of semiconductors, photoresist liquids must be precisely and accurately dispensed and deposited on the wafer being treated. In conventional apparatus for photoresist application, wafers to be processed are positioned beneath a suitable nozzle which then dispenses a predetermined amount of photoresist liquid to coat the wafer. Typically the wafer is then rotated to disperse the deposited liquid evenly over the entire surface of the wafer. It is readily apparent that the rate of dispensing and the amount of liquid dispensed are critical in this process.

When fluid flow is stopped through the nozzle, such as between wafer treatments, the potential exists for droplets of photoresist liquid from the nozzle to form and fall onto the wafer positioned below the nozzle. This can destroy the pattern being formed on the wafer, requiring that the wafer be discarded or reprocessed.

In order to avoid the formation of deleterious droplets on the nozzle, external stop/suckback valves are commonly used. Such valves are typically a dual pneumatically controlled valve pair, with one valve stopping the flow of liquid to the nozzle, and the other drawing the liquid back from the dispense end or outlet port of the nozzle. This not only helps prevent droplet formation and dripping at the port, but also helps prevent drying of the exposed surface of the liquid, which can lead to clogging of the nozzle, and reduces fluid contamination at the outlet.

The rate at which each of these stop/suckback valves closes or opens effects the fluid in different ways. If the stop valve opens or closes too fast, the fluid column can "spit" a droplet of fluid onto the wafer, deleteriously altering the coating thickness. If the suckback valve is changed too quickly, the fluid column will cavitate, creating a bubble in the column, again deleteriously altering the thickness of the resulting coating on the wafer.

One approach used to address this problem is the use of needle valves in series with the pneumatic input and exhaust lines. The needle valves provide regulation of the pressure change at the valve. However, this method of controlling the valve has various pitfalls. For example, the cleanliness of the controlling gas is an issue, as is the likelihood of dirt collecting on the valve seat. Similarly, any variation of the incoming pressure can decrease the reliability of this approach, as can mechanical vibration. Over time, any of the foregoing drawbacks can alter the valve performance. As a result, the liquid dispense must be monitored and manually adjusted periodically. This can be time-consuming and is not cost effective.

The coating of larger wafers (e.g., 300 mm in diameter and larger) is also problematic, as turbulence issues arise. The rotational speed of the wafer is conventionally used to spread the coating fluid from the center of the wafer where it is applied, radially outwardly to the edge of the wafer. However, this approach creates turbulent air flow over the wafer and can result in uneven or nonuniform coatings. Reducing the spin speed with larger wafers reduces the turbulence at the surface of the wafer, but can instroduce new problems. With the reduced speed, the fluid moves slower across the wafer, and thus spreading the fluid to the wafer edge before the fluid begins to setup or dry becomes an issue.

It therefore would be desirable to provide a stop/suckback valve system that results in precise, reproducible dispensing of fluid without the foregoing disadvantages. In addition, the present invention has broader applications to any pneumatic fluid control device, especially where precise control of fluid flow is desired or required.

It would be further desirable to provide a control system that allows for multiple dispense points on a substrate such as a large wafer, in order to reduce or eliminate the turbulence issues that arise when processing larger wafers, and to provide uniform coatings on the wafers.

SUMMARY OF THE INVENTION

The problems of the prior art have been overcome by the present invention, which provides a control system for monitoring (preferably digitally) and/or controlling pressure to a pneumatic load such as a stop/suckback valve. Pressure is sensed in the pneumatic fluid input lines to the pneumatic load, and a closed loop control is used to maintain the pressure at a predetermined level. The pressure(s) can be continuously or continually monitored, and valves modulated to obtain the desired result. The control system has applicability to fluids having a wide range of viscosities, it being capable of accurately and repeatably dispensing such fluids with minimal operator involvement.

In an alternative embodiment, the control system is used to ensure equal dispensing in multi-point dispense apparatus. Thus, pressure is sensed downstream of each valve in fluid communication with a respective nozzle. Any pressure differential is indicative of unequal dispense rates through the nozzle, and is compensated for by appropriate valve adjustment.

In yet another embodiment of the present invention, multiple dispense points are used to dispense a coating fluid onto a substrate simultaneously or sequentially. This will decrease the time needed to coat a large substrate such as a wafer, since the dispense occurs at different points along the substrate surface that can be controlled by the user.

DETAILED DESCRIPTION OF THE PRESENT INVENTION

Figure 1:
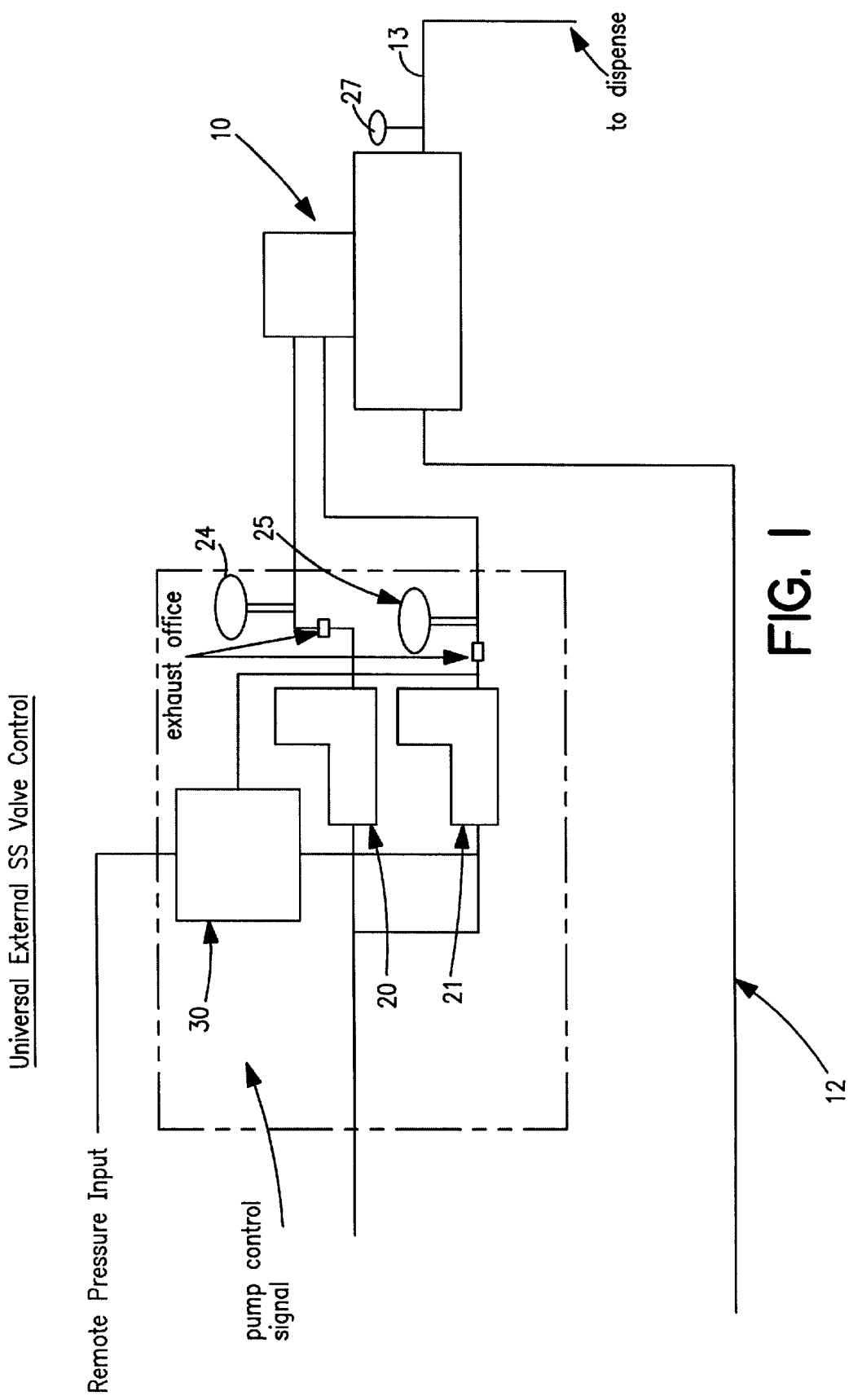
FIG. 1 is a schematic representation of the control system of the present invention.
Figure 2:
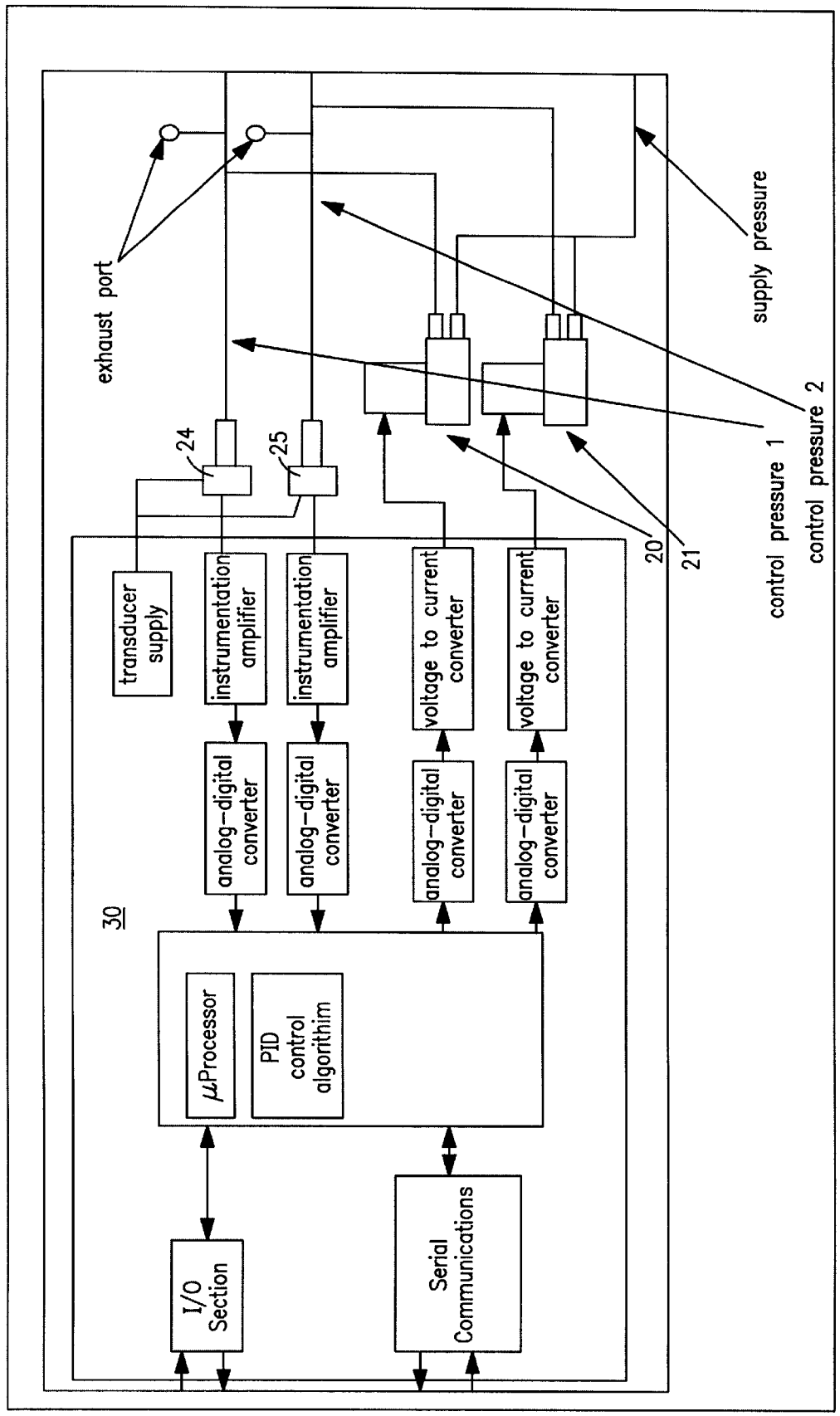
FIG. 2 is a schematic representation of the control system of the present invention, showing the processor in greater detail.

Turning now to FIGS. 1 and 2, there is shown a control system in accordance with the preferred embodiment of the present invention. A fluid control device such as a conventional stop/suckback valve 10 is shown having a liquid inlet line 12 and a liquid outlet line 13. The liquid outlet line 13 is in fluid communication with a nozzle or other dispensing means (not shown) for ultimate dispensing of the liquid to a point of use, such as a substrate which can be a wafer. A pair of flow restrictors such as solenoids 20, 21 are pneumatically connected to the stop/suckback valve 10 as shown. One flow restrictor is connected to the stop portion of the valve, and the other preferably independently to the suckback portion of the valve. Pressure is sensed in the pneumatic fluid outlet of each flow restrictor, such as by conventional pressure transducers 24, 25. Each pressure transducer 24, 25 is in communication with a computer processor or control circuit 30, such as a controller having proportional, integral and derivative (PID) feedback components as detailed in FIG. 2. As each pressure transducer 24, 25 samples the pressure in its respective pneumatic fluid line, it transmits the sampled data to the controller 30. The controller 30 compares the sampled pressure to a predetermined value, and operates the flow restrictors feeding the inlet lines to the stop/suckback valve 10 accordingly. This ensures that the pressure in each pneumatic fluid line is independently maintained constant or at a desired value.

By controlling the pressure to the valves, various fluid dispensing parameters can be controlled. For example, where the liquid to be dispensed is a low viscosity liquid, the stop valve can be carefully modulated using pressure to ensure uniform dispensing of the liquid. Similarly, the rate at which the liquid is dispensed can be controlled, as can the rate at which the liquid is sucked back from the point of dispensing by the suckback valve. Once the pressure-to-volume relationship of the particular valve being used is characterized, unlimited flexibility can be obtained using the system of the present invention. Indeed, dispense pressure is a good indicator of the quality (e.g., uniformity) of the dispense, but an "ideal" dispense pressure profile does not exist for all applications and is not consistent amongst all valves. The control system of the present invention allows the process engineer to adjust the dispense pressure to achieve the "ideal profile" for a particular process application once the characteristics of the valve are known.

The control unit 30 has a signal conditioner for each pressure transducer 24, 25. This circuit conditions a strain gauge signal into an electrical signal (analog) of sufficient amplitude that an analog to digital converter (A/D) can measure this signal. The pressure signal is read by an on-board microprocessor. The microprocessor calculates a digital value that is sent to a digital to analog converter as an analog signal. This analog signal drives a voltage to current converter that will power the control solenoids.

The control algorithm that calculates the digital control signal can use operator and factory parameters and current pressure to calculate the appropriate solenoid current. This is repeated every 10–15 milliseconds until the controller is signaled to stop by the pump or track. The algorithm may be a PID or a modified PID control loop with solenoid offset. The basic operation creates an error signal. This error signal is modified by the programmed parameters and converted to a drive signal for the control solenoid.

More specifically, the instrumentation amplifiers condition the pressure signals to ±10 volts for a pressure change of 0–100 psi. The measured pressure is the current pressure applied to the pneumatic fluid control device. In the embodiment shown, the pneumatic fluid control device is a pneumatic valve with two sections; one for stopping the fluid from flowing and the other for drawing the leading edge of the fluid back from the dispensing point to prevent dripping. The analog-to-digital converters change the analog pressure signals to a digital format which then can be read by the microprocessor. The pressure signals from the transducers are inputted to the PID control algorithm. The configuration of this setup uses a fast control algorithm, which allows the controller to change the required setup pressure, or set point, quickly, and the pressure tracks the set point change. Each set point and control pressure is independent, making the interactions conventionally associated with this process virtually non-existent. Thus, the operator can separately set the "stop" and "suckback" operations.

The output of the PID is an "error signal", which is a combination of the proportional error (the difference between the current pressure and the current set point), the derivative (the rate of change in pressure over time), and the integral (the attenuation of the rate of change in pressure signal over time) The error signal is then corrected for the solenoid driver. The solenoid driver also calculates an integral and derivative to adjust for variations from valve to valve. The corrected error signal is converted from digital format to an analog signal, and the resulting analog signal is sent to a voltage-to-current convertor which drives the control valve to a new position. This operation is repeated from each valve every 10–15 milliseconds.

Various process parameters can be set to ensure proper operation over a wide variety of applications. For example, the stop valve "on" pressure parameter is the pressure applied to the stop section of the pneumatic valve during the actual dispensing of the liquid. Increasing and decreasing this pressure changes the average dispense pressure. This parameter can be especially useful for high viscosity liquids where it may be advantageous to operate the valve in its less than fully open position. The stop valve "delay" parameter can be used to offset the initial pressure build-up prior to the valve actually opening upon the application of pressure to it. If the dispensing liquid is allowed to dispense too early, it would result in "drooling", whereas if too much pressure is allowed to build-up, "spitting" of the liquid can occur. The stop valve "on time" parameter is used to control the rate at which the pressure is changed to the valve; causing the valve to open too fast will result in anomalies in the dispense stream. The stop valve "off pressure" parameter is used to control the response time of the valve. When the actual closing pressure of the valve is reached, applying less pressure will do little to the closing characteristics of the valve, but will increase response time.

Similar parameters are provided for the suckback valve. Suckback valve "off time" adjusts the time of the ON to OFF pressure transition. This is the time to move the end of the valve column from it's fully extended position to the suckback position. Moving this too fast can cause the column to pull a bubble of air into the column or cavitate. Suckback valve "on time" adjusts the time of the OFF to ON pressure transition. This is the time necessary to move the end of the valve column from the suckback position to the fully extended position. Moving this too fast can cause the column to "bulge", which can deleteriously change the actual dispense rate.

Figure 3:
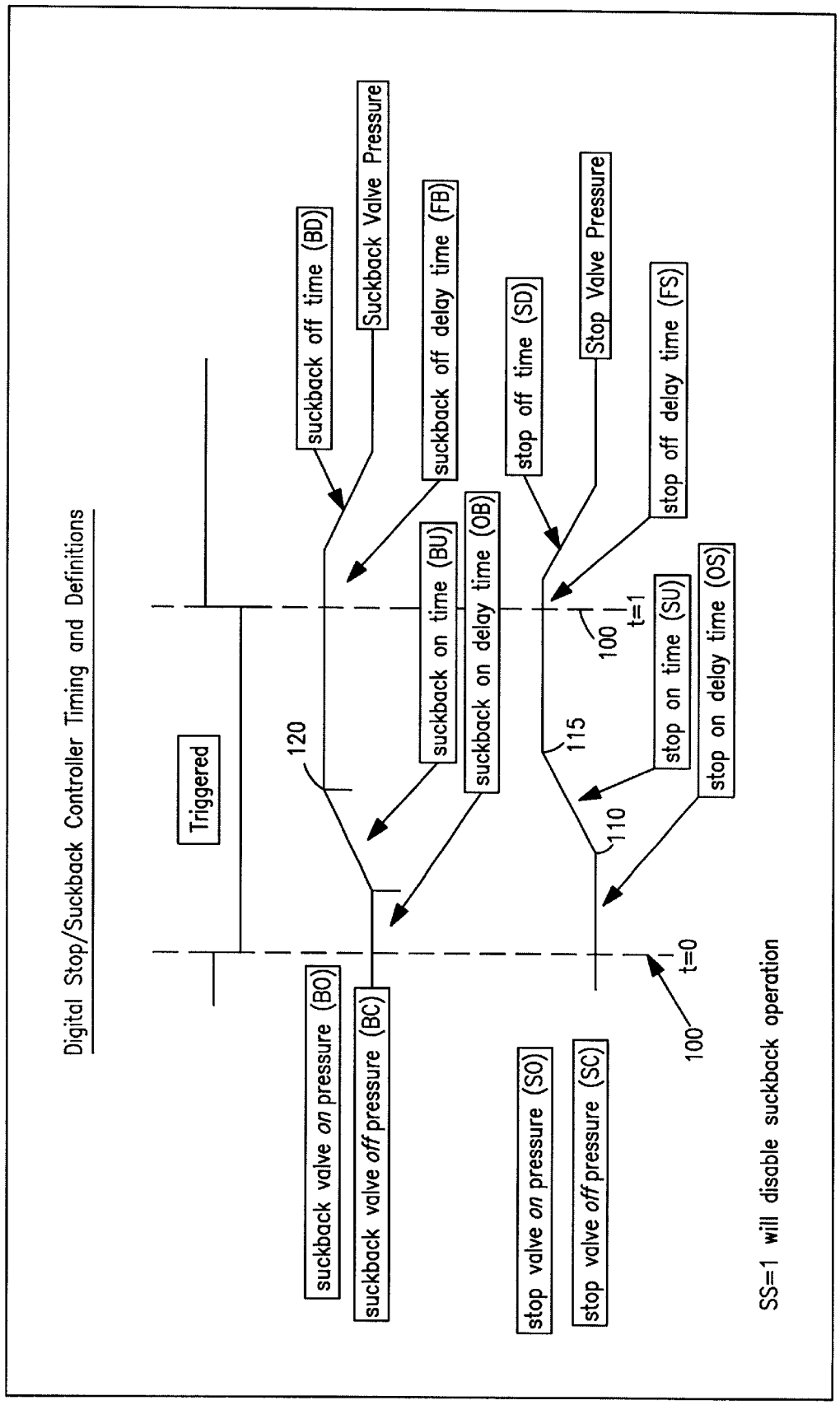
FIG. 3 is a schematic representation of the controller timing in accordance with the present invention.

FIG. 3 graphically illustrates an example of the controller timing in one particular embodiment of the present invention. At time zero, shown by vertical line 100, the pump is triggered. The pressures to the stop valve and to the suckback valve are off. Once the system is triggered, the stop valve on delay time is used in order to gradually increase the pressure to the stop valve once the stop valve "on" time is actuated (at 110). The stop valve pressure is fully on at 115. Similarly, the suckback valve on delay time is used to gradually increase the pressure to the suckback valve, which is fully applied at 120. At the completion of the cycle at t=1 at vertical line 200, the stop valve off delay time delays the decrease in pressure to the stop valve, which is then gradually decreased until the valve is closed. A slightly longer delay is used for the suckback valve as shown.

Figure 4:
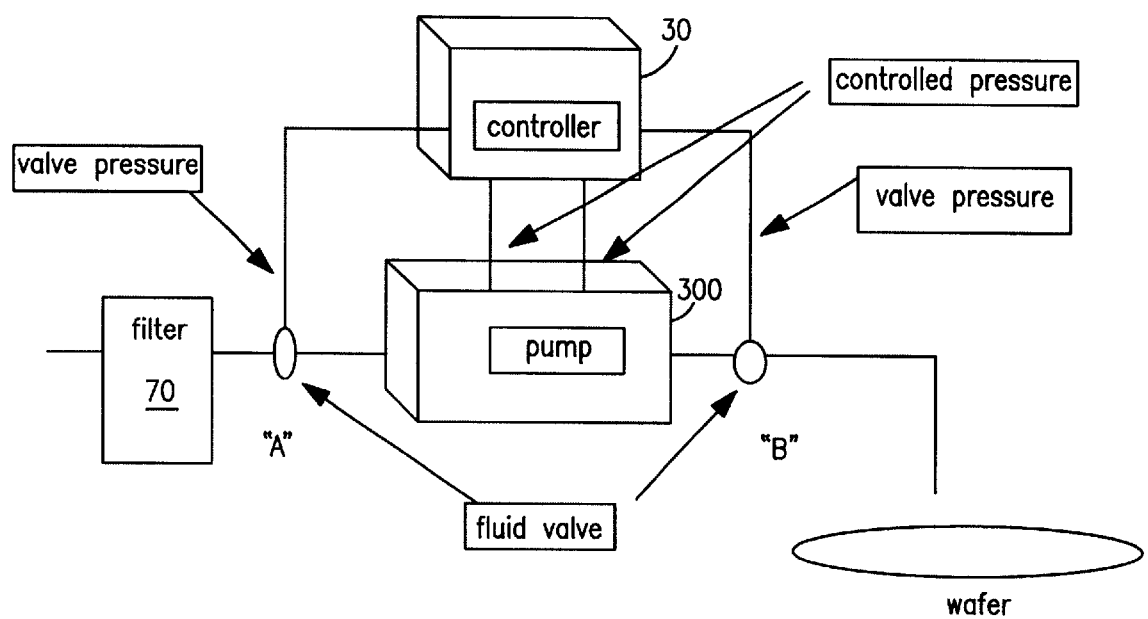
FIG. 4 is a schematic representation of the control system in another embodiment of the present invention.

In addition, the control system of the present invention can be used to operate a pneumatically driven fluid dispense device such as a pump. With reference to FIG. 4, by reversing the control input to one side of the controller 30, the controller 30 is used to control vacuum. Fluid is drawn into pump 300 (such as through optional filter 70) and through inlet valve "A" by applying vacuum to the pump diaphragm. Once the pump 300 is filled with fluid, the inlet valve "A" is closed. Dispense from the pump 300 is accomplished by applying pressure to the same diaphragm and opening the outlet valve "B". The pump 300 will dispense fluid at a rate proportional to the pressure applied and by controlling the time the outlet valve "B" is open, the programmed amount of fluid is dispensed. Also, suckback can be carried out by precisely controlling the vacuum and pressure at the end of the dispense.

Figure 6:
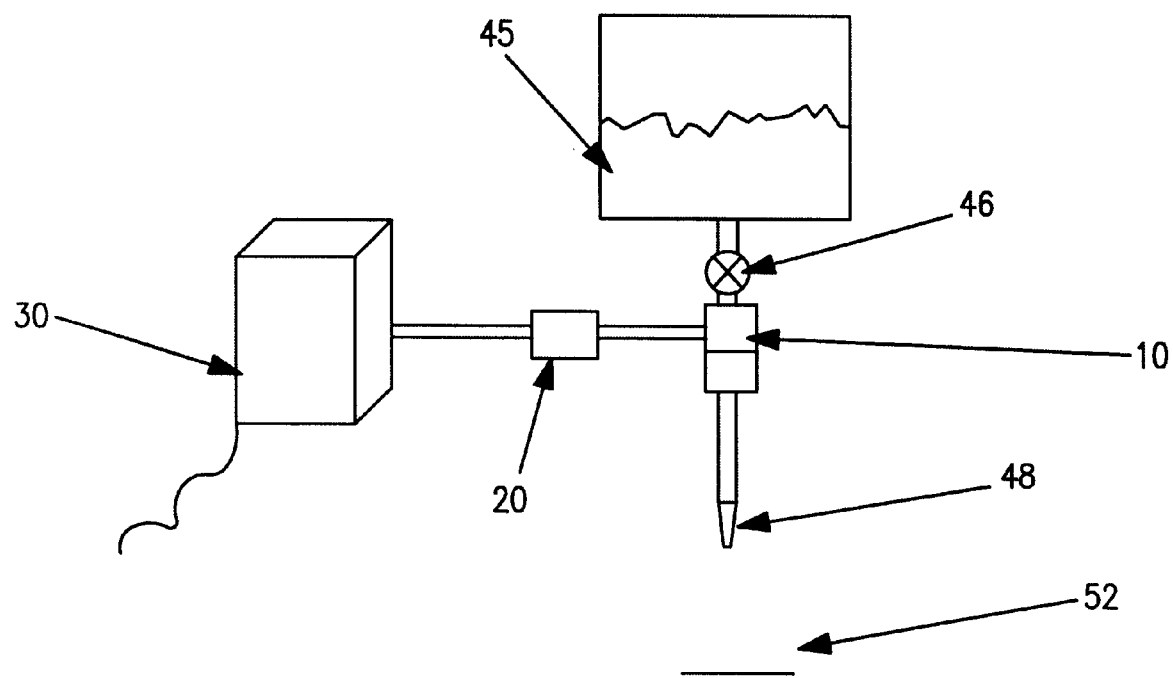
FIG. 6 is a schematic representation of an embodiment wherein the dispensed fluid is driven by gravity.

The mechanism used to drive the fluid to the dispense point is preferably a pump. However, other drive sources could be used, such as a gravity feed system as shown in FIG. 6. A fluid reservoir 45 contains the fluid to be dispensed, and is positioned with respect to the substrate such that it flows out of the reservoir by gravity. A flow valve 46 is used as a restrictor to control the flow rate. Flow restrictor (such as a solenoid) 20 is in communication with a pneumatic load such as a stop/suckback valve 10 and with a computer processor or control circuit 30 as in the previous embodiments. The pneumatic load is in fluid communication with a dispense point such as nozzle 48, which dispensed fluid onto the substrate 52. The controller 30 actuates the flow restrictor 20 with precision timing that controls the start and stop of fluid dispense.

In an alternative embodiment, the control system of the present invention can be used in applications of multiple point dispense from a single dispense source. The dispense accuracy with multipoint dispense is directly dependent on the downstream pressure of each dispense point; the downstream pressure becomes critical to maintain equal dispense volumes from two (or more) dispense points with a single supply source such as a pump. Thus, each dispenser (such as a nozzle) includes a liquid line having a valve, which can be a stop/suckback valve. Pressure is sensed with a suitable pressure transducer 27 in each line downstream of the valve. (It can be assumed that the pressure upstream of the valve is equal in each line. Alternatively, pressure also can be sensed upstream of each valve where enhanced accuracy is desired.) The pressure transducers 27 are in communication with a computer processor which is responsive to each pressure being sensed. The processor 30 compares the pressures. If any differential pressure is detected, one or more of the valves can be modulated (such as with solenoids 20, 21) to equalize the pressures and ensure equal dispense rates through each nozzle. For example, the pressure input from transducers 27 can control the "full open" pressure of the "stop" portion of the stop/suckback valve 10. When the stop valve is not in its fully open position, a pressure drop across the valve is created. By measuring the pressure downstream of each valve prior to each dispense point, the stop/suckback valve on each dispense point can be used as a "controlled restriction" and balancing each dispense pressure results in balanced dispensing. This embodiment can be used alone, or in combination with the control system for the pneumatic load discussed above.

Figure 5:
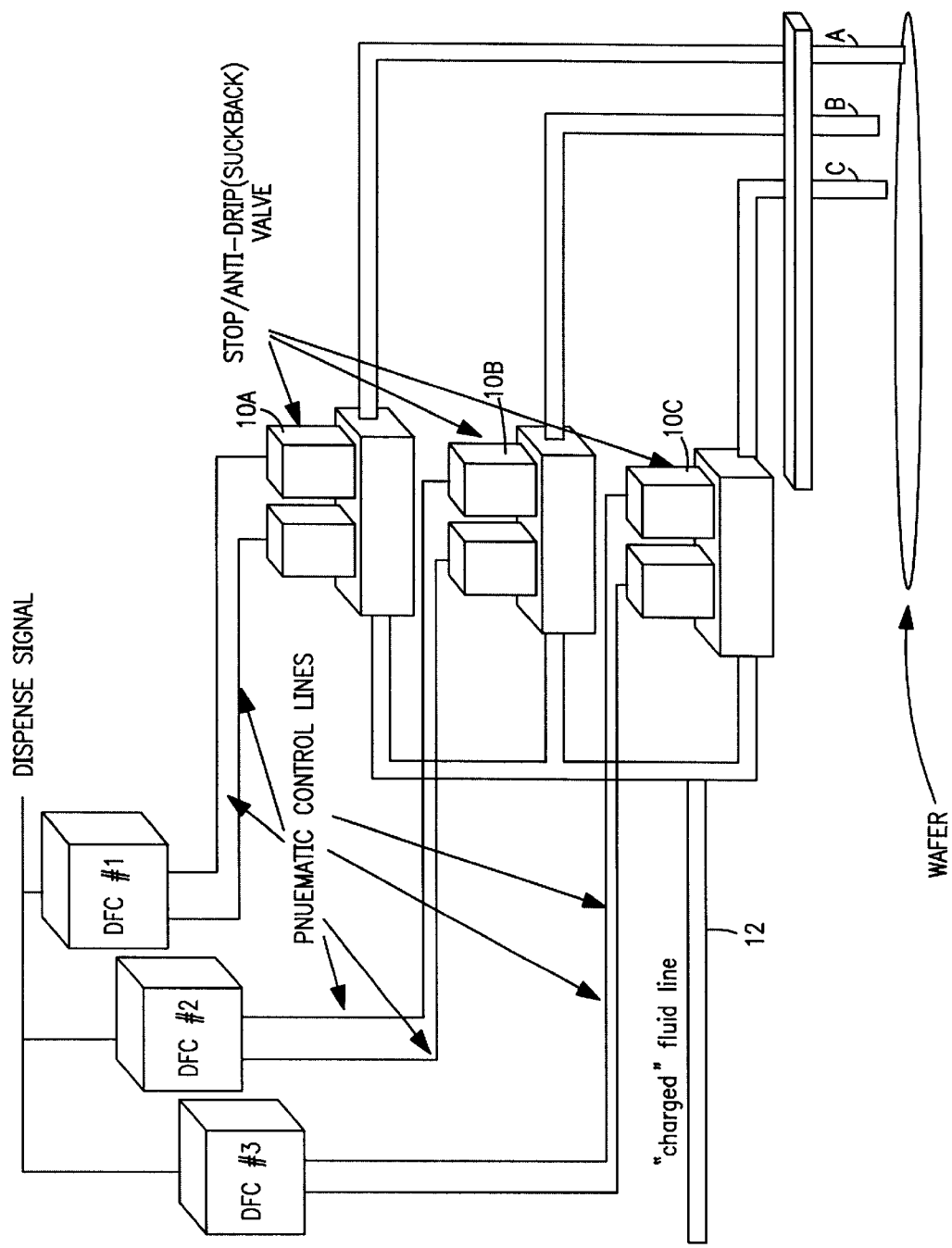
FIG. 5 is a schematic representation of a multiple dispense point embodiment of the present invention.

In yet another embodiment of the present invention, a multiple dispense system can be used to dispense fluid from a plurality of dispense points that are preferably independently controlled. The repeatability and control provided by the digital flow controllers and valves, preferably stop/suckback valves, allows their application as a dispense control element. Using a single dispense signal from the control system and the adjustments on the flow controllers, including "on delay", "off delay", "open time" and "close time", a plurality of valves can be controlled synchronously or sequentially. For example, FIG. 5 shows a relatively large wafer being coated from three dispense points A, B and C positioned radially along the wafer substrate. Although three dispense points are shown, those skilled in the art will appreciate that fewer or more could be used, depending in part on the size of the substrate to which the fluid is being applied. Each dispense point is in fluid communication with a respective valve, such as a stop/suckback valve 10A, 10B, 10C. Each valve receives fluid from a fluid source (which fluid could be the same or different) via fluid inlet line(s) 12. Each valve is also in communication with a flow controller (DFC #1, DFC #2 and DFC #3) via respective pneumatic control lines. As in the embodiment of FIG. 1, each flow controller DFC includes a pneumatic flow restrictor such as a solenoid. In the case of a stop/suckback valve, two flow restrictors are preferred, one in pneumatic communication with the stop portion of the valve, the other with the suckback portion of the valve. Pressure is sensed in the pneumatic output of each flow restrictor, and a signal responsive thereto is sent to the controller. The flow restrictors are then operated accordingly. Each of the dispense points A, B and C can be triggered to dispense at the same time. Where sequential or other non-simultaneous dispensing is desired, the internal time delays for each controller can be used to effectuate non-simultaneous dispensing.

In operation, a wave of fluid can be created using the multiple dispense system of the present invention in view of its timing and control accuracy. Thus, dispense point A can initially dispense the fluid onto the wafer. As the fluid from dispense point A reaches the area of the wafer under dispense point B, dispense point B can begin dispensing fluid to maintain the wafer motion, and so forth. The correct wave motion is important for proper coating. This same process can be repeated with any number of dispense points as required. The ability to accurately control ramp up rate, ramp down rate and maximum rate allows the user to achieve a uniform coating.

Those skilled in the art will appreciate that in the embodiment where the flow controller is used in processing wafers, the wafer processing is typically carried out in a track of which the instant control system for dispensing fluid onto the wafer is one of many processing stations. Such mutlistation processing is disclosed in U.S. Pat. No. 6,016,006, the disclosure of which is incorporated herein by reference.

EXAMPLE

The controller is programmable by the user over an RS232/RS485 serial link. The user inputs the following parameters:

stop valve close transition time
  stop valve open transition time
  suckback valve close transition time
  suckback valve open transition time
  stop valve open delay time
  stop valve close delay time
  input or trigger hardware configuration
  input or trigger active state
  output or acknowledgement hardware configuration
  output or acknowledgement active state The factory calibration is also done over the serial link:

control solenoid (stop) offset
control solenoid (suckback) offset
control solenoid (stop) slope
control solenoid (suckback) slope
control algorithm inputs (system parameters, pneumatic tubing length, etc.)

The start signal is sent to the controller by the dispense pump or track. Once this signal is received, the controller measures the pressure on the outlet side of the control solenoids and calculates a current or "position" for the control solenoid and sends this value to the D/A converter which is applied to the control solenoid. This is repeated every 10–15 ms to maintain an accurate pressure to the stop/suckback valve. Once the controller senses that it has reached the programmed pressure, a signal is returned to the pump or track. The pressure will be maintained until the start signal is removed. When the controller senses that the pressure has returned to zero, the pump will again be signaled.

What is claimed is:

1. A control system for modulating a pneumatic fluid control device for dispensing a fluid, said control system comprising:

a flow restrictor having a pneumatic fluid outlet in fluid communication with said fluid control device;

a pressure sensor to sense pressure in said pneumatic fluid outlet;

a computer processor responsive to said pressure sensor for controlling the pressure in said pneumatic fluid outlet at a predetermined time in order to modulate said fluid control device to a predetermined open position over a predetermined amount of time to initiate fluid flow therethrough, said processor adapted to maintain the pressure in said pneumatic fluid outlet for a predetermined amount of time so as to maintain said fluid control device in said predetermined open position and adapted to control the pressure in said pneumatic fluid outlet so as to modulate said fluid control device to a predetermined closed position over a predetermined amount of time in order to cease fluid flow therethrough.

2. The control system of claim 1, further comprising a second flow restrictor having a second pneumatic fluid outlet, said second pneumatic fluid outlet being in fluid communication with a second fluid control device; and a second pressure sensor to sense pressure in said second pneumatic fluid outlet;

wherein said computer processor is also responsive to said second pressure sensor for controlling the pressure in said second pneumatic fluid outlet at a predetermined time in order to modulate said second fluid control device to a predetermined open position over a predetermined amount of time to initiate fluid flow therethrough, said processor adapted to maintain the pressure in said second pneumatic fluid outlet for a predetermined amount of time so as to maintain said second fluid control device in said predetermined open position and adapted to control the pressure in said second pneumatic fluid outlet so as to modulate said second fluid control device to a predetermined closed position over a predetermined amount of time in order to cease fluid flow therethrough.

3. The control system of claim 2, wherein said first and second flow restrictors are solenoids.

4. The control system of claim 1, wherein said fluid control device is a pneumatic valve.

5. The control system of claim 4, further comprising a nozzle in fluid communication with said pneumatic valve for dispensing fluid to a substrate.

6. The control system of claim 2, wherein said second fluid control device is a pneumatic valve.

7. The control system of claim 6, further comprising a nozzle in fluid communication with said pneumatic valve for dispensing fluid to a substrate.

8. The control system of claim 1, further comprising a pump for supplying fluid to said fluid control device.

9. The control system of claim 1, wherein fluid is supplied to said fluid control device by gravity.

10. A multi-point dispense control system for dispensing at least one fluid to a substrate, comprising:

fluid supply means for supplying at least one fluid to be dispensed to a plurality of dispense outlets, each said dispense outlet being in fluid communication with at least one valve;

a plurality of flow restrictors, each having a pneumatic fluid line in pneumatic communication with each said valve;

a pressure sensor positioned to sense pressure in each said pneumatic fluid line;

a computer processor responsive to each said pressure sensor for controlling the pressure in each said pneumatic line at a predetermined time in order to modulate each said plurality of flow restrictors to a predetermined open position over a predetermined amount of time to initiate fluid flow through said dispense outlets, said processor adapted to maintain the pressure in each said pneumatic line for a predetermined amount of time so as to maintain each said flow restrictor in said predetermined open position and adapted to control the pressure in each said pneumatic line so as to modulate each said flow restrictor to a predetermined closed position over a predetermined amount of time in order to cease fluid flow through said dispense outlets.

11. The system of claim 10, wherein said substrate is a wafer, and wherein said plurality of dispense outlets are arranged radially along said wafer.

* * * * *